United States Patent
Park et al.

(10) Patent No.: US 7,620,879 B2
(45) Date of Patent: Nov. 17, 2009

(54) METHOD OF DETECTING OCCURRENCE OF ERROR EVENT IN DATA AND APPARATUS FOR THE SAME

(75) Inventors: Jihoon Park, Minneapolis, MN (US); Jaekyun Moon, Minneapolis, MN (US); Jun Lee, Yongin-si (KR)

(73) Assignees: Samsung Electronics Co., Ltd., Suwon-si (KR); University of Minnesota, Minneapolis, MN (US)

( * ) Notice: Subject to any disclaimer, the term of this patent is extended or adjusted under 35 U.S.C. 154(b) by 631 days.

(21) Appl. No.: 11/224,351

(22) Filed: Sep. 13, 2005

(65) Prior Publication Data

US 2007/0079209 A1    Apr. 5, 2007

(51) Int. Cl.
*H03M 13/00* (2006.01)

(52) U.S. Cl. ................. 714/785; 714/792; 714/794; 714/795; 714/758; 375/262; 375/341; 375/265

(58) Field of Classification Search ............ 714/795, 714/794, 785; 375/262, 265, 341
See application file for complete search history.

(56) References Cited

U.S. PATENT DOCUMENTS

| | | | |
|---|---|---|---|
| 6,185,173 B1 * | 2/2001 | Livingston et al. ....... 369/59.21 |
| 6,427,220 B1 | 7/2002 | Vityaev | |
| 6,460,150 B1 | 10/2002 | Cideciyan et al. | |
| 6,530,060 B1 * | 3/2003 | Vis et al. ................. 714/792 |
| 6,581,182 B1 | 6/2003 | Lee | |
| 6,604,222 B1 | 8/2003 | Jensen | |
| 6,732,328 B1 | 5/2004 | McEwen et al. | |
| 6,914,948 B2 | 7/2005 | Kuki et al. | |
| 6,931,585 B1 | 8/2005 | Burd et al. | |
| 2003/0152175 A1 | 8/2003 | Kuki et al. | |

* cited by examiner

*Primary Examiner*—Guy J Lamarre
(74) *Attorney, Agent, or Firm*—Sughrue Mion, PLLC

(57) ABSTRACT

A method of detecting an occurrence of an error event in data and an apparatus for the same are provided. The method includes: preparing an error detection code wherein syndrome sequences for dominant error events are all different; generating a codeword from source data using the error detection code; detecting the occurrence of the dominant error event in the codeword by checking a syndrome computed from the codeword; and determining a type and likely error starting positions of the occurred dominant error event using the syndrome sequences correspond to the syndrome.

30 Claims, 18 Drawing Sheets

FIG. 3

| $E_{dt}/N_{50}$ (dB)/BER | DOMINANT ERROR EVENTS | FREQUENCY (%) |
|---|---|---|
| 17 ($8.4700 \times 10^{-4}$) | ±[2 -2]<br>±[2 -2 2]<br>±[2 -2 2 -2]<br>±[2 -2 2 -2 2]<br>±[2 -2 0 2 -2]<br>±[2 -2 2 -2 2 -2] | 59.2814<br>19.8935<br>6.1211<br>4.1916<br>2.9275<br>1.7964 |
| | | (94.2116) |
| 18 ($1.6600 \times 10^{-4}$) | ±[2 -2]<br>±[2 -2 2]<br>±[2 -2 2 -2]<br>±[2 -2 2 -2 2]<br>±[2 -2 0 2 -2]<br>±[2 -2 2 -2 2 -2] | 63.8957<br>19.2339<br>5.4605<br>3.4230<br>1.8745<br>1.7930 |
| | | (95.6805) |
| 19 ($2.2600 \times 10^{-5}$) | ±[2 -2]<br>±[2 -2 2]<br>±[2 -2 2 -2]<br>±[2 -2 2 -2 2]<br>±[2 -2 2 -2 2 -2]<br>±[2 -2 0 2 -2] | 67.8082<br>19.5205<br>4.6804<br>2.6256<br>1.8265<br>1.5982 |
| | | (98.0594) |
| 20 ($2.2520 \times 10^{-6}$) | ±[2 -2]<br>±[2 -2 2]<br>±[2 -2 2 -2 2]<br>±[2 -2 2 -2]<br>±[2 -2 2 -2 2 -2]<br>±[2 -2 0 2 -2] | 65.5340<br>18.9320<br>4.8544<br>3.8835<br>2.9126<br>0.9709 |
| | | (97.0874) |

FIG. 4

| DOMINANT ERROR POLYNOMIAL $e(x)$ at density 1.4 | REMAINDER $(p(x)=1+x+x^3)$ | REMAINDER $(p(x)=1+x^2+x^3)$ |
|---|---|---|
| $(1+x)$ | $(1+x)$ | $(1+x)$ |
| $(1+x+x^2)$ | $(1+x+x^2)$ | $(1+x+x^2)$ |
| $(1+x+x^2+x^3)$ | $x^2$ | $x$ |
| $(1+x+x^2+x^3+x^4)$ | $x$ | $(1+x^2)$ |
| $(1+x+x^3+x^4)$ | $(x+x^2)$ | 1 |
| $(1+x+x^2+x^3+x^4+x^5)$ | $(1+x^2)$ | $(x+x^2)$ |

FIG. 5

| ACTUAL FORM | POLYNOMIAL FORM |
|---|---|
| ±[2,-2] | $1+x$ (irreducible) |
| ±[2,-2, 2] | $1+x+x^2$ (irreducible) |
| ±[2,-2, 2,-2] | $1+x+x^2+x^3 = (1+x)(1+x^2) = (1+x)^3$ |
| ±[2,-2, 2,-2, 2] | $1+x+x^2+x^3+x^4$ (irreducible) |
| ±[2,-2, 0, 2,-2] | $1+x+x^3+x^4 = (1+x)(1+x^3) = (1+x)^2(1+x+x^2)$ |
| ±[2,-2, 2,-2, 2,-2] | $1+x+x^2+x^3+x^4+x^5 = (1+x+x^2)(1+x^3)$ |

FIG. 6

| DOMINANT ERROR POLYNOMIAL | SYNDROME SEQUENCE IN DECIMAL NUMBER |
|---|---|
| $1+x$         | 6  3  4  2  1  5  7 |
| $1+x+x^2$     | 7  6  3  4  2  1  5 |
| $1+x+x^2+x^3$ | 2  1  5  7  6  3  4 |
| $1+x+x^2+x^3+x^4$ | 5  7  6  3  4  2  1 |
| $1+x+x^3+x^4$ | 4  2  1  5  7  6  3 |
| $1+x+x^2+x^3+x^4+x^5$ | 3  4  2  1  5  7  6 |

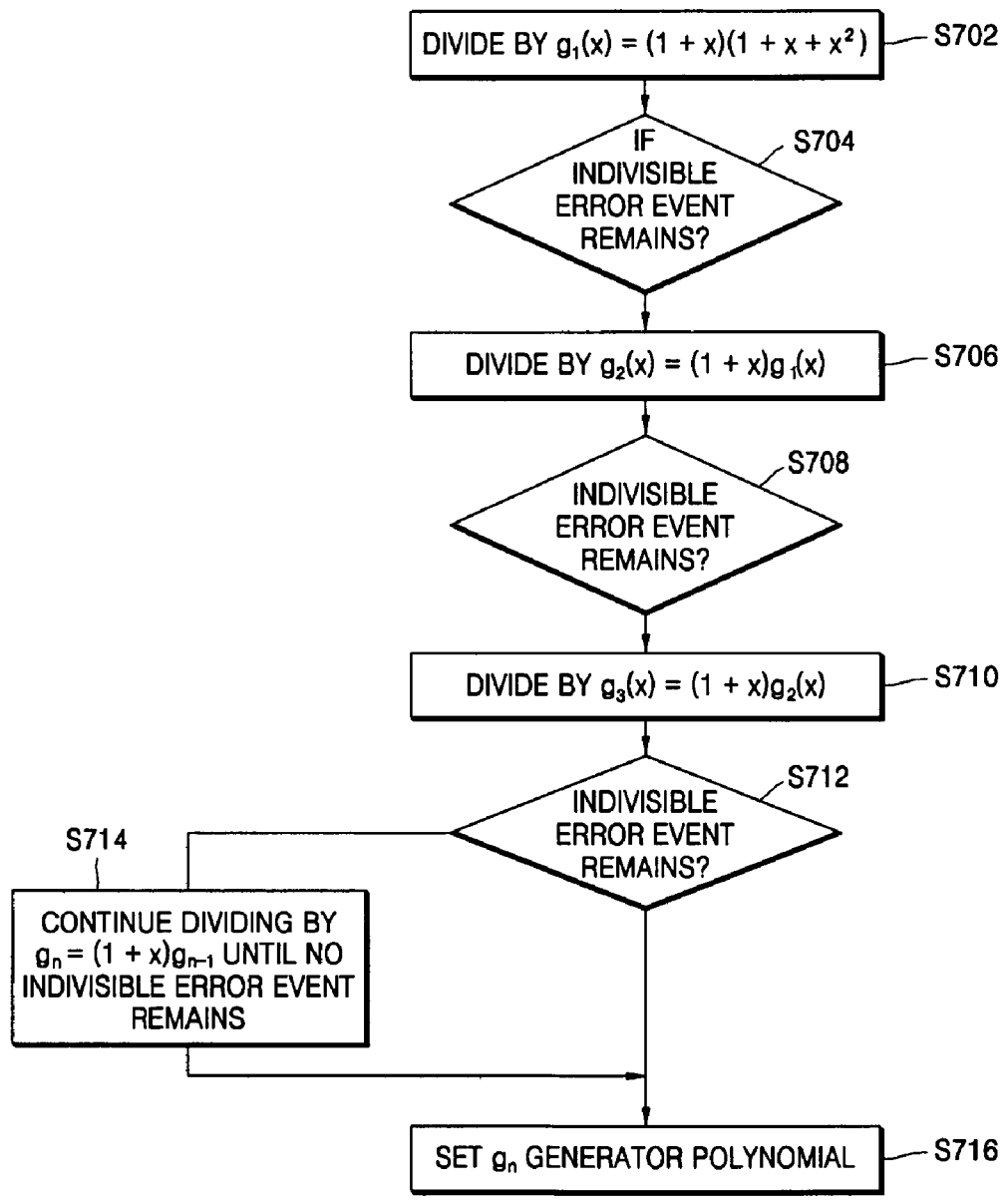

FIG. 8

| DOMINANT ERROR EVENTS | SYNDROME BY $g_2(x)$ IN POLYNOMIAL FORM | SYNDROME SEQUENCE IN DECIMAL NUMBER |
|---|---|---|
| ±[2,-2] | 1+x | [12, 6, 3] |
| ±[2,-2, 2] | $1+x+x^2$ | [14, 7] |
| ±[2,-2, 2,-2] | $1+x+x^2+x^3$ | [15, 10, 5] |
| ±[2,-2, 2,-2, 2] | $x^2$ | [2, 1, 13, 11, 8, 4] |
| ±[2,-2, 0, 2,-2] | 0 | 0 |
| ±[2,-2, 2,-2, 2,-2] | $1+x^3$ | [9] |

FIG. 9

| DOMINANT ERROR EVENTS | SYNDROME BY $g_2(x)$ IN POLYNOMIAL FORM | SYNDROME SEQUENCE IN DECIMAL NUMBER |
|---|---|---|
| ±[2,-2] | 1+x | [24, 12, 6, 3, 23, 29] |
| ±[2,-2, 2] | $1+x+x^2$ | [28, 14, 7, 21] |
| ±[2,-2, 2,-2] | $1+x+x^2+x^3$ | [30, 15, 17] |
| ±[2,-2, 2,-2, 2] | $1+x+x^2+x^3+x^4$ | [31, 25, 26, 13, 16, 8, 4, 2, 1, 22, 11, 19] |
| ±[2,-2, 0, 2,-2] | $1+x+x^3+x^4$ | [27] |
| ±[2,-2, 2,-2, 2,-2] | $x+x^4$ | [9, 18] |

FIG. 10

| POSITION | 1 | 2 | 3 | 4 | 5 | 6 | 7 | 8 | 9 | 10 | 11 | 12 | ...... | (6k-5) | (6k-4) | (6k-3) | (6k-2) | (6k-1) | (6k) |
|---|---|---|---|---|---|---|---|---|---|---|---|---|---|---|---|---|---|---|---|
| SYNDROME | 24 | 12 | 6 | 3 | 23 | 29 | 24 | 12 | 6 | 3 | 23 | 29 | ...... | 24 | 12 | 6 | 3 | 23 | 29 |

FIG. 11

| POSITION | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
|---|---|---|---|---|---|---|---|---|---|---|---|---|---|---|---|---|---|---|---|---|---|---|---|---|---|---|---|---|---|---|---|---|---|---|---|---|
| c | 0 | 0 | 0 | 1 | 0 | 0 | 1 | 0 | 1 | 0 | 0 | 0 | 1 | 1 | 1 | 1 | 1 | 1 | 1 | 0 | 1 | 1 | 1 | 1 | 0 | 0 | 0 | 0 | 0 | 0 | 0 | 1 | 0 | 0 | 1 | 0 |
| e | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| r | 0 | 0 | 1 | 0 | 0 | 0 | 1 | 0 | 1 | 0 | 0 | 0 | 1 | 1 | 1 | 1 | 1 | 1 | 1 | 0 | 1 | 1 | 1 | 1 | 0 | 0 | 0 | 0 | 0 | 0 | 0 | 1 | 0 | 0 | 1 | 0 |
| t | | | 3 | 4 | | | | | 9 | 10 | | | | | 15 | 16 | | | | | 21 | 22 | | | | | 27 | 28 | | | | | 33 | 34 | | |
| s | | | 3 | 4 | | | | | 9 | 10 | | | | | | | | | | | 21 | 22 | | | | | | | | | | | | | | |

- c : TRANSMITTED CODEWORD (cH$^T$ = [0 0 0 0 0])
- e : ERROR EVENT ([1 1 1])
- r : ML CODEWORD (rH$^T$ = 6 = [0 0 1 1 0])
- t : SET OF POSSIBLE STARTING POSITIONS OF THE ERROR EVENT BASED ON SYNDROME
- s : SET OF MORE PROBABLE STARTING POSITIONS ON THE SIGN OF BITS (SEARCH SPACE)

FIG. 12

| CODEWORD LENGTH, n | 204 | 216 | 228 | 240 | 252 | 264 | 276 | 288 | 300 | 312 | 324 | 336 |
|---|---|---|---|---|---|---|---|---|---|---|---|---|
| CODE RATE, R | 0.9755 | 0.9769 | 0.9781 | 0.9792 | 0.9802 | 0.9811 | 0.9819 | 0.9826 | 0.9833 | 0.9840 | 0.9846 | 0.9851 |

FIG. 15

| POSITION | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
|---|---|---|---|---|---|---|---|---|---|---|---|---|---|---|---|---|---|---|---|---|---|---|---|---|---|---|---|---|---|---|---|---|---|---|---|---|
| c | 0 | 0 | 0 | 1 | 0 | 0 | 0 | 1 | 0 | 0 | 0 | 0 | 0 | 0 | 1 | 1 | 1 | 1 | 1 | 1 | 0 | 1 | 1 | 1 | 1 | 1 | 0 | 0 | 0 | 0 | 0 | 0 | 1 | 0 | 0 | 1 |
| e | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| r | 0 | 0 | 1 | 0 | 0 | 0 | 0 | 1 | 0 | 1 | 0 | 0 | 0 | 0 | 1 | 1 | 1 | 1 | 1 | 1 | 0 | 1 | 1 | 1 | 1 | 1 | 0 | 0 | 0 | 0 | 0 | 0 | 1 | 0 | 0 | 1 |
| t | | | 3 | 4 | | | | | 9 | 10 | | | | | 15 | 16 | | | | | 21 | 22 | | | | | 27 | 28 | | | | | 33 | 34 | | |
| s | | | 3 | 4 | | | | | 9 | 10 | | | | | | | | | | | 21 | 22 | | | | | | | | | | | | | | |

FIG. 16

| DOMINANT ERROR EVENTS | SYNDROME BY $g_3(x)$ IN POLYNOMIAL FORM | SYNDROME SEQUENCE IN DECIMAL NUMBER |
|---|---|---|
| ±[2,-2] | $1+x$ | [24, 12, 6, 3, 23, 29] |
| ±[2,-2, 2] | $1+x+x^2$ | [28, 14, 7, 21] |
| ±[2,-2, 2,-2] | $1+x+x^2+x^3$ | [30, 15, 17] |
| ±[2,-2, 2,-2, 2] | $1+x+x^2+x^3+x^4$ | [31, 25, 26, 13, 16, 8, 4, 2, 1, 22, 11, 19] |
| ±[2,-2, 0, 2,-2] | $1+x+x^3+x^4$ | [27] |
| ±[2,-2, 2,-2, 2,-2] | $x+x^4$ | [9, 18] |

| DOMINANT ERROR EVENT AT BOUNDARY | SYNDROME BY $g_3(x)$ IN POLYNOMIAL FORM | SYNDROME SEQUENCE IN DECIMAL NUMBER |
|---|---|---|
| ±[2] | $x$ | [16, 8, 4, 2, 1, 22, 11, 19, 31, 25, 26, 13] |
| ±[-2, 0, 2, -2] | $1+x^2+x^3$ | [22, 11, 19, 31, 25, 26, 13, 16, 8, 4, 2, 1] |
| ±[2,-2, 0, 2] | $1+x+x^3$ | [26, 13, 16, 8, 4, 2, 1, 22, 11, 19, 31, 25] |

FIG. 17

| CODEWORD 1 | CODEWORD 2 |
|---|---|
| 2 | -2 |
| 2 | -2 2 |
| 2 -2 2 | -2 |
| 2 | -2 2 -2 2 |
| 2 -2 2 -2 2 | -2 |

FIG. 18

| SYNDROME FOR CODEWORD 1 | SYNDROME FOR CODEWORD 2 |
|---|---|
| 13 | 16 |
| 13 | 24 |
| 21 | 16 |
| 13 | 36 |
| 19 | 16 |

FIG. 19

| ERROR TYPE | OCCURRENCE PROBABILITY | CORRECTABILITY (CONVENTIONAL SCHEME) | CORRECTABILITY (NEW SCHEME) |
|---|---|---|---|
| SINGLE ERROR EVENT IN A CODEWORD ||||
| DOMINANT ERROR EVENT WITHIN A CODEWORD | 92.5 % | YES (UNIGNORABLE MISS-CORRECTION) | YES (VERY RARE MISS-CORRECTION) |
| DOMINANT ERROR EVENT AT CODEWORD BOUNDARY | 2.65 % | YES (UNIGNORABLE MISS-CORRECTION) | YES (VERY RARE MISS-CORRECTION) |
| NON-DOMINANT ERROR EVENT | 2.70 % | NO | NO |
| MULTIPLE ERROR EVENTS IN A CODEWORD ||||
| DOMINANT ERROR EVENTS WITHIN A CODEWORD | 2.00 % | PARTIAL CORRECTION/NO (SOMETIMES) | NO |
| DOMINANT ERROR EVENTS AT CODEWORD BOUNDARIES | 0.05 % | NO | NO |
| NON-DOMINANT ERROR EVENTS | 0.10 % | NO | NO |

FIG. 21

| | $p_1$ | $p_2$ | $p_3$ |
|---|---|---|---|
| SNR = 16dB | | | |
| UNCODED ML | $8.3400 \times 10^{-3}$ | $2.0840 \times 10^{-3}$ | $1.6000 \times 10^{-5}$ |
| CONVENTIONAL POST-VITERBI | $4.9400 \times 10^{-3}$ | $1.2000 \times 10^{-3}$ | $2.0000 \times 10^{-5}$ |
| NEW POST-VITERBI | $4.5074 \times 10^{-3}$ | $1.4845 \times 10^{-3}$ | |
| | $p_1$ | $p_2$ | $p_3$ |
| SNR = 17dB | | | |
| UNCODED ML | $2.4300 \times 10^{-3}$ | $5.7600 \times 10^{-4}$ | |
| CONVENTIONAL POST-VITERBI | $5.4400 \times 10^{-4}$ | $2.2000 \times 10^{-4}$ | $3.0000 \times 10^{-6}$ |
| NEW POST-VITERBI | $5.3441 \times 10^{-4}$ | $2.2672 \times 10^{-4}$ | |
| | $p_1$ | $p_2$ | $p_3$ |
| SNR = 18dB | | | |
| UNCODED ML | $4.9500 \times 10^{-4}$ | $1.1850 \times 10^{-4}$ | |
| CONVENTIONAL POST-VITERBI | $4.2500 \times 10^{-5}$ | $3.2800 \times 10^{-5}$ | $2.0000 \times 10^{-7}$ |
| NEW POST-VITERBI | $3.8583 \times 10^{-5}$ | $1.6437 \times 10^{-5}$ | |

METHOD OF DETECTING OCCURRENCE OF ERROR EVENT IN DATA AND APPARATUS FOR THE SAME

BACKGROUND OF THE INVENTION

1. Field of the Invention

The present invention relates to an error correction coding method and a post-Viterbi processor, and more particularly, to a method of detecting an occurrence of an error event in data, and an apparatus for the same.

2. Description of the Related Art

It is well known that the performance of a partial response maximum likelihood (PRML) system can be improved by employing a post-Viterbi processor that corrects dominant error events at the output of a detector. The idea is that once an error is detected, an attempt is made to correlate an estimated error signal with each of known forms of the dominant error patterns and identify the most likely error pattern and its position within a code word. The estimated error signal is constructed by taking a difference between an actual equalizer output and a Viterbi detector output stream convolved with an equalizer target response.

FIG. 1 illustrates a conventional post-Viterbi processor. Referring FIG. 1, the post-Viterbi processor comprises a target encoder 110, a syndrome check unit 111, a bank of error correlation filters 114, a selector 116, and an error correction unit 120.

Data is encoded by an error detection coding (EDC) encoder 102 before it is transmitted through a readback channel 104, which is, as well known, a part of a PRML system. An equalizer 106 equalizes data received through a readback channel 104 and then a maximum likelihood (ML) detector 108 detects the encoded data from the equalized data based on Viterbi algorithm. However, the detected data from the ML detector 108 may contains errors caused by noise on the readback channel 104.

The post-Viterbi processor, shown in FIG. 1, performs error correction on dominant error events, so that the possibility of error correction can be increased.

FIG. 2 shows a mathematical model of the post-Viterbi processor shown in FIG. 1. Assuming that a is recorded data, a' is recorded data estimated by an ML detector 208 and P(D) is a partial response polynomial, then an output of an equalizer 208 y and error e are expressed as Y=a*p+n and E=(a−a')*p+n respectively. Here, n is total noise and * denotes a convolution operation.

In general, cyclic redundancy check (CRC) is used as an EDC based on a syndrome computation unit 218. A conventional CRC code usually plays a single role in the detection of an occurrence of a dominant error event in a codeword, not yielding any information about the type and the position of the detected dominant error event. To solve this problem, the post-Viterbi processor was introduced to produce the type and the position of the detected dominant error event.

The idea of the post-Viterbi processor is that once the error is detected, an attempt is made to correlate the estimated error signal with each of known forms of the dominant error patterns and identify the most likely error pattern and its position within the codeword. The estimated error signal is constructed by taking a difference between the actual equalizer output and the Viterbi detector output stream convolved with the equalizer target response.

A bank of error correlation filters 214 comprises a plurality of matched filters, each of which being associated with one of dominant error events, respectively. Accordingly, each of the matched filters produces a likelihood value for its assigned type of error events. A selector 216 selects the largest likelihood value among outputs of the plurality of matched filters. A correction unit 220 corrects error, likely occurred in the estimated data by noise predictive Viterbi (NPV) decoding with the syndromes computed in the syndrome computation unit 218 and the error type and the position from the selector 216.

However, since the set of syndromes from the syndrome computation unit 218 cannot differ from the type of error events, the conventional post-Viterbi processor has a higher miscorrection probability. The dominant detectable error events are ±[2, −2], ±[2, −2, 2], ±[2, −2, 2, −2], ±[2, −2, 2, −2, 2], ±[2, −2, 0, 2, −2] and ±[2, −2, 2, −2, 2, −2] at density 1.4 under the assumption of 50% AWGN and 50% medium noise in perpendicular recording and the six error correlation filters are associated with these error events. Therefore, once an error detection code detects any dominant error events, they are corrected based on the information about a type and a location of the error events provided by the bank of the error correlation filters. But, as mentioned earlier, the type and position of an occurred dominant error event are determined by the output of a bank of error correlation filter only, so all occurred dominant error events are not possible to be corrected completely, which is a miscorrection.

Thus, there is a need for an error correction scheme that can produce a unique set of syndromes for each dominant error event so that the type of an occurred dominant error event can be immediately determined by one syndrome computation without any ambiguity, which almost eliminates the misselection in a conventional post-Viterbi processor for a single dominant error event within a codeword.

SUMMARY OF THE INVENTION

According to an aspect of the present invention, there is provided of a method for detecting an occurrence of an error event in data, the method comprising:

(a) preparing an error detection code wherein syndrome sequences for dominant error events are all different;

(b) generating a codeword from source data using the error detection code;

(c) detecting the occurrence of the dominant error event in the codeword by checking a syndrome computed from the codeword; and (d) determining a type and likely error starting positions of the occurred dominant error event using the syndrome sequences correspond to the syndrome. According to an exemplary embodiment of the present invention, there is provided of a method for detecting an occurrence of an error event in data, the method comprising (a) preparing an error detection code wherein syndrome sequences are remainders as result of dividing a dominant error event polynomial having a coefficient as a dominant error event by a non-primitive generator polynomial g(x) of degree m whose period is less than $2^m - 1$ (b) calculating a source data shift polynomial from a source data;

(c) dividing the source data shift polynomial by the non-primitive generator polynomial g(x) and calculating a remainder of the source data shift polynomial;

(d) obtaining the codeword in which the remainder of the source data shift polynomial is added to the source data.

(e) providing the codeword to a medium;

(f) detecting the occurrence of the dominant error event in the codeword from the medium by checking a syndrome obtained from the provided codeword;

(g) determining a type of the detected dominant error event in the codeword by comparing the syndrome obtained in said operation (f) with the syndrome sequences in said operation (a) correspond to the detected dominant error event; and (h) determining a location of the detected error event in the codeword, wherein the dominant error is at least one of ±{+}, ±{+−}, ±{+−+}, +{+−+−}, ±{+−+−+}, ±{+−+−+−}, ±{+−0+−}, ±{+−0 0+−} and ±{+−0+−0+−}.

According to another aspect of the present invention, there is provided an apparatus for detecting error events in a codeword, the apparatus comprising:

an data encoder generating a codeword from source data using an error detection code wherein syndrome sequences for dominant error events are all different; and an error detector detecting an occurrence of the dominant error event in the codeword received from the data encoder.

Additional aspects of the invention will be set forth in part in the description which follows and, in part, will be apparent from the description, or may be learned by practice of the invention.

BRIEF DESCRIPTION OF THE DRAWINGS

The above and/or other aspects of the invention will become apparent and more readily appreciated from the following description of the exemplary embodiments of the present invention, taken in conjunction with the accompanying drawings of which:

FIG. 3 shows dominant error events and their frequencies associated with each signal-to-noise ratio (SNR) and bit error rate (BER), at density 1.4;

FIG. 4 shows remainders dividing dominant error e(x) by $p(x)=1+x+x^3$ or $p(x)=1+x^2+x^3$;

FIG. 5 shows dominant error events and their polynomial forms at density 1.4;

FIG. 6 shows syndrome sequences with a primitive generator polynomial $g(x)=1+x^2+x^3$;

FIG. 7 illustrates a method of generating a non-primitive generator polynomial according to an exemplary embodiment of the present invention;

FIG. 8 shows syndrome sequences with a non-primitive generator polynomial $g_2(x)=1+x+x^3+x^4$;

FIG. 9 shows syndrome sequences with a non-primitive generator polynomial $g_3(x)=1+x^2+x^3+x^5$;

FIG. 10 shows possible starting positions of the error event ±[2, −2] based on its syndrome value is 6;

FIG. 11 shows a way to find possible positions for an occurred error event ±[2, −2] based on its syndrome;

FIG. 12 shows code rates associated with codeword lengths respectively;

FIG. 15 shows a way to find possible positions for an occurred error event based on its syndrome;

FIG. 16 shows syndrome sequences associated with dominant error event and end-around case;

FIG. 17 illustrates end-around cases producing a single error event ±[2] in case of the post-Viterbi processor of FIG. 14;

FIG. 18 illustrates syndrome values for the end-around cases producing single error event ±[2] shown in FIG. 17;

FIG. 19 illustrates the comparison of BERs at user density 1.4 according to the present invention;

FIG. 21 shows an example of statistics of symbol errors at 16, 17 and 18 dB.

DETAILED DESCRIPTION OF THE EXEMPLARY EMBODIMENTS

Figure 1:
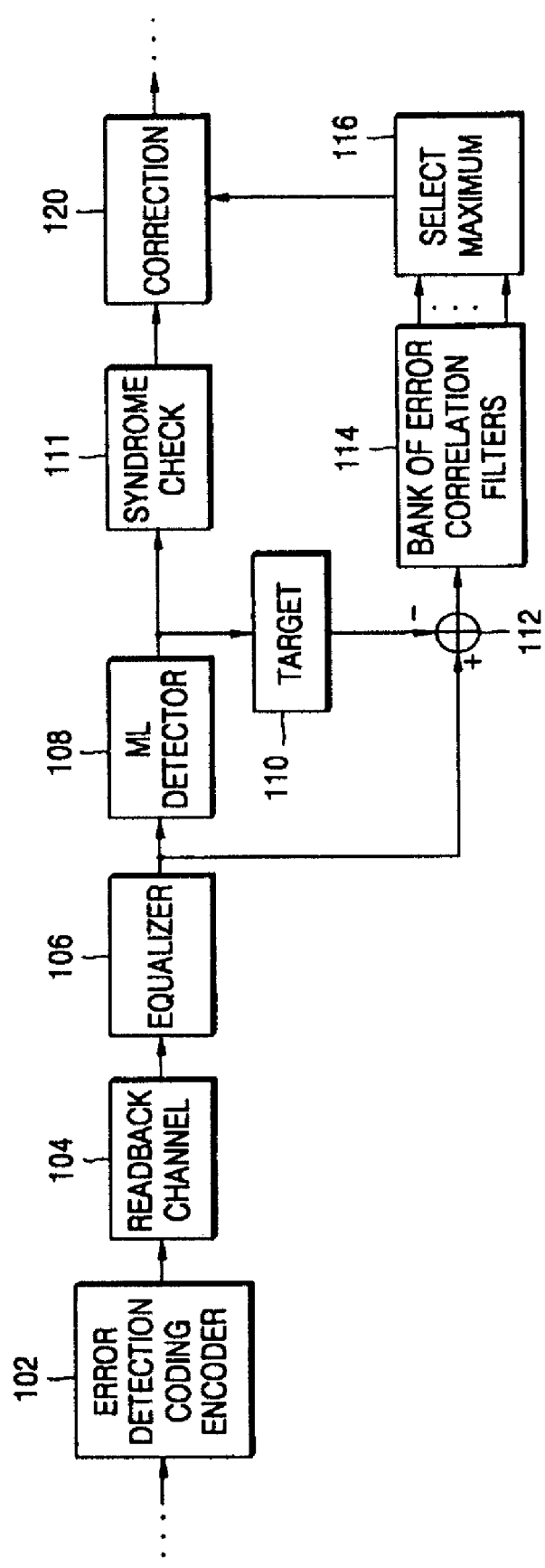
FIG. 1 illustrates a conventional post-Viterbi processor.
Figure 2:
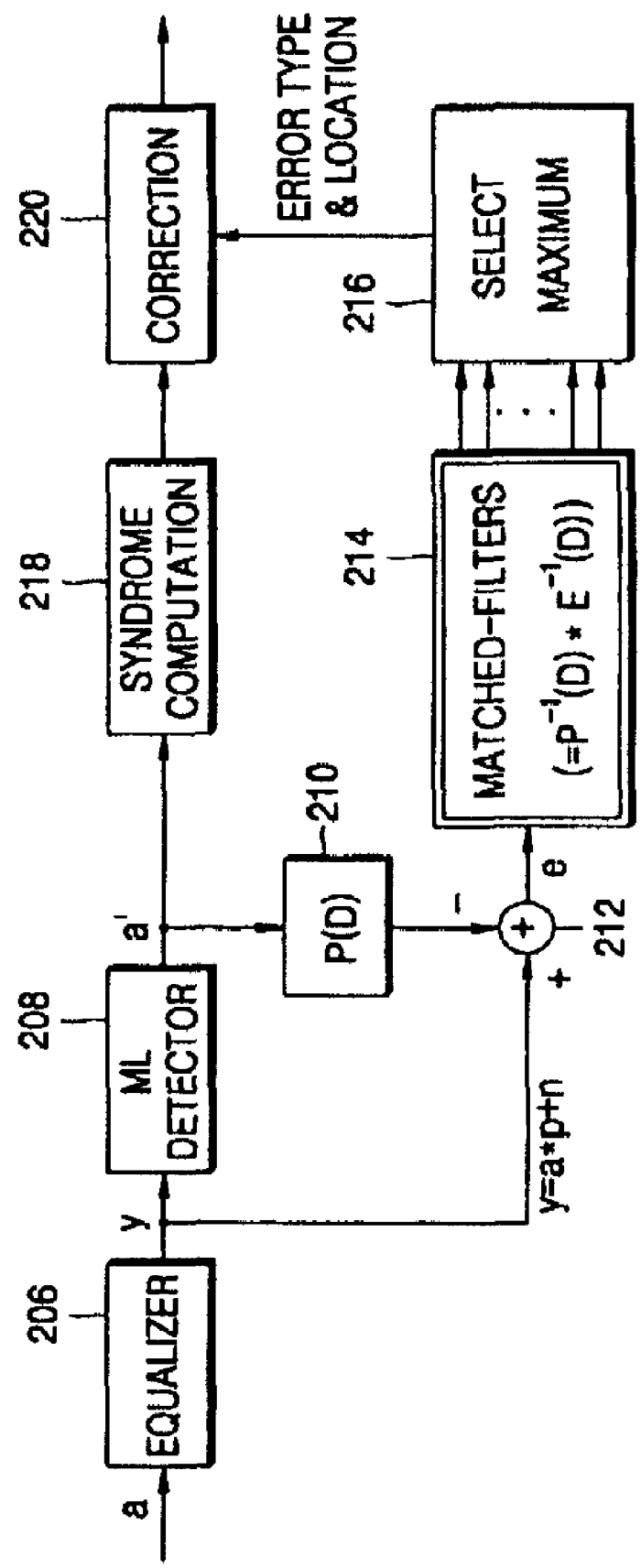
FIG. 2 shows a mathematical model of the post-Viterbi processor shown in FIG. 1.

Reference will now be made in detail to the exemplary embodiments of the present invention, examples of which are illustrated in the accompanying drawings, wherein like reference numerals refer to the like elements throughout. The exemplary embodiments are described below to explain the present invention by referring to the figures.

FIG. 3 shows dominant error events and their frequencies associated with each signal-to-noise ratio (SNR) and bit error rate (BER), at density 1.4. Referring to FIG. 3, an error event is considered as a dominant error event when its frequency is greater or almost equal to 1%, compared to all occurred error events. Although the order of dominant error events for each SNR is somehow different, the set of dominant error events is the same for all SNRs. Thus, assuming 50% AWGN and 50% medium noise, the dominant error events at density 1.4 are [2, −2], [2, −2, 2], [2, −2, 2, −2], [2, −2, 2, −2, 2], [2, −2, 0, 2, −2] and [2, −2, 2, −2, 2, −2].

Here, the dominant error events have been obtained from the effective distance analysis and/or computer simulations at various densities mixed noise environments. Among them, the dominant error events at density 1.4 and mixed noise consisting of 50% AWGN and 50% medium noise is shown in FIG. 3. A hyperbolic tangent transition response is assumed with equalizer target response of $1+6D+7D^2+2D^3$ employed.

A CRC code is specified by its generator polynomial and the CRC value is the remainder when a received codeword polynomial is divided by the generator polynomial. For an (n,k) CRC code based on a generator polynomial g(x) of degree (n−k), a data polynomial b(x) of degree (k−1) or less is encoded into a codeword polynomial c(x) of degree (n−1) or less, i.e., $$c(x)=b(x)g(x)=c_0+c_1x+c_2x^2+\ldots+c_{n-1}x^{n-1} \quad (1)$$

Suppose that $\bar{c}(x)$ is a readback polynomial with some errors. Let s(x) be the CRC value of $\bar{c}(x)$, i.e., the syndrome which has degree less than (n−k). Then, $\bar{c}(x)$ can be expressed as $$\bar{c}(x)=c(x)+e(x)=g(x)q(x)+s(x) \quad (2)$$

where e(x) is an error polynomial of degree (n−1) or less, q(x) is the quotient, and the division is performed over a binary Galois field, GF(2). For the erroneous readback polynomial $\bar{c}(x)$, if the syndrome s(x) is not the zero polynomial, then the CRC checker detects the error e(x), otherwise, it fails to detect it.

While it is obvious that the degree (n−k) of a generator polynomial g(x), which is the number of parity bits required, should be greater than the highest degree of all given dominant error polynomials to certify error detection capability, it is desirable to find a generator polynomial having the smallest possible degree for a high-rate error-detection code. Also, since a primitive generator polynomial yields the largest number of distinct syndromes, which would be useful for many purposes, the detectability is examined with primitive polynomial(s) of as small degree as possible.

Suppose a length-l dominant error polynomial $e^{(\rho)}(x)$ occurred within a length-n codeword is given by $$e^{(\rho)}(x)=x^{\rho}\cdot(e_0+e_1x+e_2x^2+\ldots+e_{l-1}x^{l-1}) \quad (3)$$

where $0 \leq \rho \leq n-1$. When $\rho$ is n-l, the length-l dominant error event ends at the last position of a codeword. It is well known that a primitive polynomial p(x) of degree m divides $x^n+1$, where n is the multiple of $(2^m-1)$, but x is not a factor of p(x). Consequently, $x^\rho$ must not be divided by p(x). Thus, once a primitive polynomial p(x) gives non-zero syndromes for $e^{(0)}(x)$, its shifted version within a codeword, $e^{(\rho)}(x)$ for $0<\rho \leq n-1$, must not be divisible by p(x).

Although error detection has been successful for any dominant error event which occurred within a codeword, its boundary should also be considered to confirm the full detectability. A dominant error event occurred at codeword boundary, $e_t^{(\eta)}(x)$, which is a truncated version of $e^{(\eta)}(x)$ can be represented as $$e_t^{(\eta)}(x)=x^\eta \cdot (e_0+e_1x+e_2x^2+\ldots+e_{n-\eta-1}x^{n-\eta-1}) \quad (4)$$

where $n-l+1 \leq \eta \leq n-1$. Here additional divisions are not necessary to check non-zero syndromes, but whether the truncated polynomial $e_0+e_1x+e_2x^2+\ldots+e_{n-\eta-1}x^{n-\eta-1}$ of any dominant error event is equivalent to the primitive polynomial p(x), i.e., $e_t^{(\eta)}(x)=x^\eta \cdot p(x)$, is rather scrutinized. If there is no such a case, error detection capability is guaranteed at codeword boundary, too.

One may argue that a dominant error event at another boundary, which is occurred at the previous codeword and ended in the present codeword, i.e., $$e_t^{(\delta)}(x)=(e_\delta+e_{\delta+1}x+e_{\delta+2}x^2+\ldots+e_{l-1}x^{l-\delta-1}) \quad (5)$$

where $1 \leq \delta \leq l-1$, has to be also surveyed for the detectability test. However, the error event $e_t^{(\delta)}(x)$ is nothing but $e_t^{(\eta)}(x)$ given in (4) in terms of the previous codeword block. As long as the detection of $e_t^{(\eta)}(x)$ is guaranteed, a post-Viterbi processor attempts to correct the detected error event associated with the previous codeword. So, it is not necessary to have additional detectability test for the error event $e_t^{(\delta)}(x)$.

Therefore, given any set of dominant error events at a wide range of density and mixed noise environment, when it is found through simple polynomial divisions and boundary checks that a primitive polynomial p(x) of the smallest possible degree always produces non-zero syndromes for any dominant error events within a codeword as well as at its boundary, then p(x) can be applied as the generator polynomial of a high-rate CRC error detection code.

For the set of dominant error events in perpendicular recording shown in FIG. 3, it can be easily seen that the degree-2 primitive polynomial $1+x+x^2$ clearly divides a dominant error polynomial $(1+x+x^2)$, so it is disregarded and the degree-3 polynomials are cast.

It is demonstrated in FIG. 4 that both degree-3 primitive polynomials $1+x+x^3$ and $1+x^2+x^3$ yield non-zero remainders for all the dominant error polynomials shown in FIG. 3. The non-divisibility signifies the detection capability of any shifted version of the dominant error events within a codeword. However, it is found that if a dominant error event ±[2, -2, 0, 2, -2] occurs at codeword boundaries, resulting into ±[2, -2, 0, 2], the error event can not be detected by $1+x+x^3$ because its error polynomial is in the form of $x^{n-4}(1+x+x^3)$. But, the other degree-3 primitive polynomial $1+x^2+x^3$ still produces non-zero syndromes for any dominant error event occurred at codeword boundary. Accordingly, a (n, n-3) CRC code generated by generator polynomial $g(x)=1+x^2+x^3$ can detect any single occurrence of all dominant error events both within a codeword and at its boundary.

If a higher-degree primitive polynomial is utilized regardless of the rate penalty, it apparently guarantees the error detection capability for all dominant error events although there are some exceptional polynomials such as $1+x+x^4$ and $1+x+x^3+x^4+x^6$ because they can respectively divide dominant error events ±[2, -2, 0, 0, 2], i.e., $x^{n-5}(1+x+x^4)$, and ±[2, -2, 0, 2, -2, 0, 2], i.e., $x^{n-7}(1+x+x^3+x^4+x^6)$, occurred at codeword boundary. However, as the degree of generator polynomial is increased, it provides worse burst error propagation, compromising the correction capability of the outer error correction code (ECC).

In a search for a primitive generator polynomial of the smallest possible degree for error detection, e.g., $g(x)=1+x^2+x^3$, the codeword length n is chosen to 203, balancing between code rate loss and error correction capability of a post-Viterbi processor. Hence, a (203, 200) CRC code generated by $g(x)=1+x^2+x^3$ has been exploited as the error detection code.

Once the CRC code gives a non-zero syndrome for any error event(s), i.e., either dominant error event or non-dominant error event, an attempt is made by a post-Viterbi processor to correlate the estimated error signal with each of known forms of the dominant error patterns and identify the most likely error pattern and its position within a codeword. However, it is observed that there are some miscorrections of a post-Viterbi processor due to correlated noise and residual inter-symbol interference (ISI). The miscorrection contains misselecting and mispositioning of an occurred dominant error event, and there has been unignorable miscorrection for a detected dominant error event.

As an example of misselection, the most dominant error event ±[2, -2] is often judged by a post-Viterbi processor as ±[2, -2, 2] or ±[2, -2, 0, 2, -2]. A dominant error event ±[2, -2, 2] is also occasionally determined as ±[2, -2] or ±[2, -2, 2,-2]. Likewise, the selection of dominant error event ±[2, -2, 2, -2, 2] or ±[2, -2, 2, -2, 2, -2] by a post-Viterbi processor is sometimes wrong. In addition to the misselection of an occurred dominant error event, there has been misposition of a correctly selected dominant error event.

For example, dominant error events ±[2, -2] and ±[2, -2, 2] become ±[2, 0, 2] and ±[2, 0, 0, 2], respectively, due to the misposition of the dominant error events. Thus, although a CRC error detection code based on a primitive generator polynomial gives full detectability for any single occurrence of dominant error events, the miscorrection of the detected dominant error events detriments the error correction capability of a post-Viterbi processor.

Thus, it seems natural to think about an error detection code that gives information about which type of dominant error event occurs. The dominant error events and their polynomial forms at density 1.4 are shown again in FIG. 5.

Since a primitive generator polynomial of degree m produces the same syndrome sequence of period $(2^m-1)$ for any dominant/non-dominant error events, the type of an occurred error event cannot be determined, but detect the occurrence of any error event whose syndrome is non-zero.

With a primitive generator polynomial $g(x)=1+x^2+x^3$, FIG. 6 shows the syndrome sequence in decimal number associated with each dominant error event. The first syndrome value in the second column means the syndrome value when a corresponding dominant error event starts to occur in the first position in a codeword block.

For example, syndrome value 6 (actually, the syndrome is [1 1 0]) for a dominant error polynomial 1+x (on the first row in FIG. 6) indicates that the error event starts to occur in the $1^{st}$ position in a received codeword block. Likewise, syndrome value 6 for a dominant error event $1+x+x^2+x^3$ (on the 3$^{rd}$ row in FIG. 6) is the syndrome value when the error event starts to occur in the 5$^{th}$ position in a received codeword block. Since all the syndrome sequences are a repeated version of a period-7 syndrome sequence [6, 3, 4, 2, 1, 5, 7], it cannot be determined which dominant error event occurs. This is because a primitive generator polynomial is employed, i.e., the period of $g(x)=1+x^2+x^3$ is 7.

However, when a non-primitive generator polynomial of degree m is applied, its period must be less than $(2^m-1)$. Thus, the syndrome values associated with each dominant error event might be different. Using the property and the given set of dominant error events, a non-primitive generator polynomial which produces unique set of syndrome sequence associated with each dominant error event is considered.

FIG. 7 illustrates a method of generating a non-primitive generator polynomial according to an exemplary embodiment of the present invention.

In operation s702, main dominant error events are divided by the irreducible polynomials $(1+x)$ and $(1+x+x^2)$, respectively. For example, Main dominant error events ±[2, −2] and ±[2, −2, 2] are divided by the irreducible polynomials $(1+x)$ and $(1+x+x^2)$, respectively. But, they are not divisible by $g_1(x)=(1+x)(1+x+x^2)=(1+x^3)$, having a period of 3, and their syndrome values are different. A dominant error event ±[2, −2, 2, −2] is not divisible by $g_1(x)$, but its syndrome sequence is the same as that of ±[2, −2]. Also, $g_1(x)$ divides other dominant error events ±[2, −2, 0, 2, −2] and ±[2, −2, 2, −2, 2, −2].

In operation s704, it is determined whether there remains any indivisible error event.

If it is determined in operation s704 that there are dominant error events which are not divisible by $g_1(x)$, then $g_2(x)=(1+x)g_1(x)=1+x+x^3+x^4$ is now considered (period=6) in operation s706. Then, syndrome sequences for ±[2, −2], ±[2, −2,2], ±[2, −2, 2, −2], ±[2, −2, −2, 2] and ±[2, −2, 2, −2, 2, −2] are different from each other. However, ±[2, −2, 0, 2, −2] is divisible by $g_2(x)$. Thus, if an error event ±[2, −2, 0, 2, −2] is not dominant, then $g_2(x)$ can be applied as a generator polynomial.

With the generator polynomial $g_2(x)=1+x+x^3+x^4$, FIG. 8 shows syndrome sequences for all dominant error events at density 1.4. Since syndrome sequences are all different for all dominant error events except for an undetected dominant error event ±[2, −2, 0, 2, −2], the type of an occurred dominant error event can be determined. But, because of the undetected dominant error event ±[2, −2, 0, 2, −2], other non-primitive generator polynomial of the same degree 4 have to be considered. However, it is found that any other polynomial of degree up to 4 does not produce all different syndrome sequences for all dominant error events. Accordingly, a higher degree non-primitive generator polynomial, i.e., degree is greater than or equal to 5 is considered.

Then, in operation s708, it is determined whether there remains any indivisible error event.

If it is determined in operation s708 that there are dominant error events which are not divisible by $g_2(x)$, then in operation s710 $g_3(x)=(1+x)g_2(x)=1+x^2+x^3+x^5$ is considered (period=12). For the detection of an error event ±[2, −2, 0, 2, −2], $g_3(x)=(1+x)g_2(x)=1+x^2+x^3+x^5$ is considered. Then, all dominant error events are detected, and their syndrome sequences are all different.

FIG. 9 shows syndrome sequences associated with dominant error events. All dominant error events at density 1.4 are successfully detected within a codeword, and the corresponding syndrome sequences are different from each other.

The periods of the syndrome sequences for all dominant error events can also be computed analytically as follows:

±[2, −2]: Since it is divisible by $(1+x)$, the period of syndrome sequence must be 6 because the other factors of $g_3(x)$ are $(1+x)^2(1+x+x^2)$ and the period is 6.

→S=[24, 12, 6, 3, 23, 29]

±[2, −2, 2]: Since it is divisible by $(1+x+x^2)$, the period of syndrome sequence must be 4 because the period of the other factors $(1+x)^3$ is 4.

S=[28, 14, 7, 21]

±[2, −2, 2, −2]: Since it is divisible by $(1+x)^3$, the period of syndrome sequence must be 3 because the period of the other factors $(1+x+x^2)$ is 3.

→S=[30, 15, 17]

±[2, −2, 2, −2, 2]: Since it is not divisible by $g_3(x)$, the period of syndrome sequence must be 12 because the period of $g_3(x)$ is 12.

→S=[31, 25, 26, 13, 16, 8, 4, 2, 1, 22, 11, 19]

±[2, −2, 0, 2, −2]: Since it is divisible by $(1+x)^2(1+x+x^2)$, the period of syndrome sequence must be 1 because the period of the other factors $(1+x)$ is 1.

→S=[27]

±[2, −2, 2, −2, 2, −2]: Since it is divisible by $(1+x)(1+x+x^2)$, the period of syndrome sequence must be 2 because the period of the other factors $(1+X)^2$ is 2.

→S=[9, 18]

It is seen in FIG. 9 that with a non-primitive generator polynomial $g_3(x)=1+x^2+x^3+x^5$, there is no repeated syndrome value for all dominant error events.

In operation s712, it is determined that there remains any indivisible error event.

If it is determined in operation s712 that there are dominant error events which are not divisible by $g_3(x)$ In s714 step, then it is in operation s714 continued to consider $g_n(x)=(1+x)g_{n-1}(x)$.

If it is determined in operation s714 that there are no dominant error events, which are not divisible by $g_n(x)$, then in operation s716 the last $g_n(x)$ is set as a generator polynomial.

Since there are no dominant error events which are not divisible by $g_3(x)$ In operation s712, the last polynomial $g_3(x)=(1+x)g_2(x)=1+x^2+x^3+x^5$ is determined as the optimum generator polynomial according to an exemplary embodiment of the present invention.

Hence, as soon as a syndrome is computed from an erroneous codeword including a dominant error event with a conventional feedback shift register, the type of the occurred dominant error event within the codeword can be immediately determined.

As an example, if a syndrome in a decimal number is 24, i.e., the actual syndrome is [1 1 0 0 0], for an occurred dominant error event within a codeword, then the detected dominant error event must be ±[2, −2] without any ambiguity. Likewise, if a syndrome for a dominant error event is 16, then the occurred dominant error event must be ±[2, −2, 2, −2, 2].

Besides determination of the type of an occurred dominant error event, possible locations of the occurred error event based on its syndrome value can be also estimated. For example, assuming that a syndrome value for a single dominant error event within a codeword is 6, the type of the error event, i.e., ±[2, −2], can be decided. Since the period-6 syndrome sequence associated with a dominant error event ±[2, −2] is a repeated version of [24, 12, 6, 3, 23, 29], i.e., [24, 12, 6, 3, 23, 29, 24, 12, 6, 3, 23, 29, . . . ], the possible starting locations of the occurred error event ±[2, −2] either 3, 9, 15, 21, . . . , and (6k−3), where k=1 . . . , n/6 and n is the codeword length.

FIG. 10 shows the syndrome values in decimal numbers and corresponding starting position for a dominant error event ±[2, −2], assuming its syndrome is 6. Since the syndrome value 6 is unique for a dominant error event ±[2, −2] only, an actual error starting position must be in the set of the possible positions. Moreover, from the set of possible starting positions of the error event ±[2, −2], the size of the set can be reduced if only opposite binary bits between those starting position and ending position, i.e., either [1 0] or [0 1] can be found, because the actual error event [2, −2] is either [2, −2] or [−2, 2]. Thus, the set of more probable error positions, so called search space, can be found.

As an example, suppose that a (36, 31) CRC code based on $g_3(x)=1+x^2+x^3+x^5$ is employed as an error detection code and a dominant error event [−2, 2] occurs in positions 3 and 4 within the codeword. The syndrome for the erroneous codeword r is 6. Thus, a dominant error event [1 1] occurs in the codeword. The syndrome value 6 indicates a set of possible starting positions of the error event, i.e., t={3, 9, 15, 21, 27 and 33}. Since the error event is in the form of [2, −2] or [−2, 2], a set of more probable starting positions, s from the set t, can be obtained, considering bits between each possible starting position and ending position. FIG. 11 summarizes this procedure.

As shown in FIG. 11, assuming a single dominant error event within a codeword, the type of the occurred dominant error event is precisely determined, and its possible occurring positions are also induced through the procedure given above. Thus, the new error detection code based on a non-primitive generator polynomial gives much less miscorrection compared to an error detection code based on a primitive generator polynomial. However, the new error detection code requires more parity bits (5 parity bits) than a conventional one, e.g., 3 parity bits.

In the above, a (203, 200) CRC code based on a primitive generator polynomial $g(x)=1+x^2+x^3$ is used as a high-rate inner error detection code (Its code rate is 0.98522). Although a CRC code based on the non-primitive generator polynomial $g_3(x)=1+x^2+x^3+x^5$ gives full detectability for any dominant error events, and information about the type and possible locations, it requires 5 parity bits because the degree of $g_3(x)$ is 5. Consequently, more code rate loss is inevitable compared to g(x). With $g_3(x)=1+x^2+x^3+x^5$, whose period is 12, a (12m, 12m-5) CRC code, where m is a positive integer, can be constructed. The code rate associated with the codeword length is given in FIG. 12.

To achieve a similar code rate to 200/203=0.98522, the codeword length should be 336. Then, the corresponding code rate is 0.9851 in FIG. 12. However, after some computer simulations for different codeword lengths, a codeword of length 336 causes more multiple error events within the codeword, which is beyond the error correction capability of a post-Viterbi processor.

Figure 13:
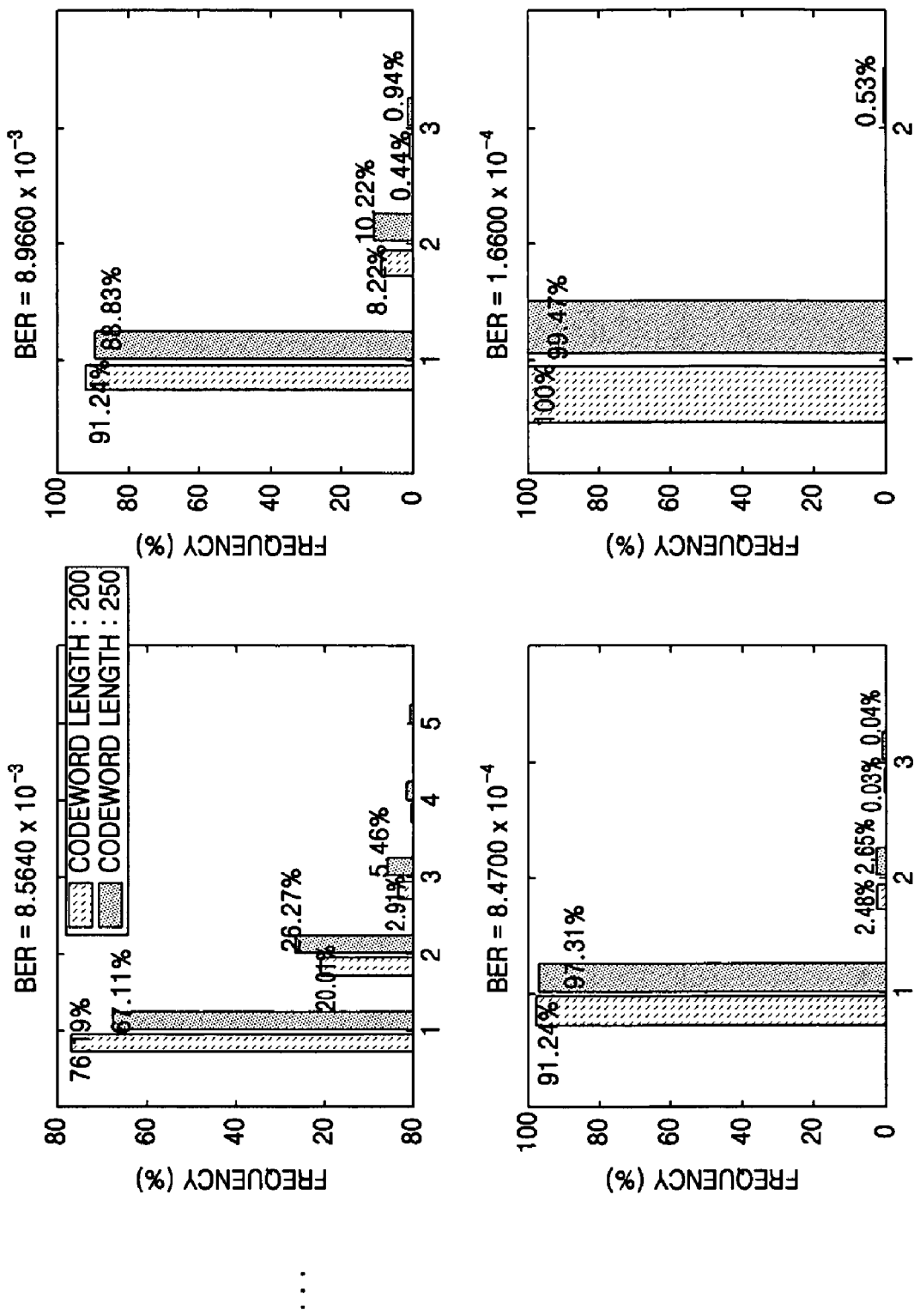
FIG. 13 shows a distribution of multiple error events in a codeword for codeword lengths 200 and 250 according to an exemplary embodiment of the present invention.

FIG. 13 shows a distribution of multiple error events in a codeword for codeword lengths, 200 and 250 according to an exemplary embodiment of the present invention. In FIG. 13, the distribution of multiple error events in a codeword is almost similar to a low BER, and a codeword of length 250 does not produce remarkable multiple error events within a codeword, compared to a codeword of length 200. Thus, 250 as a codeword length of a CRC code based on a non-primitive generator polynomial $g_3(x)=1+x^2+x^3+x^5$, i.e., (252, 247) CRC code is chosen. The resulting code rate is 0.9802 and the additional rate loss is only around 0.51%, i.e., 100×(1−0.9802/0.98522).

A new CRC error detection (252, 247) code based on a non-primitive generator polynomial $g_3(x)=1+x^2+x^3+x^5$ can determine the type of a detected dominant error event within a codeword, while a conventional CRC error detection code based on a primitive generator polynomial cannot give information about the type. In addition, the new CRC code yields possible locations for the occurred dominant error event, which is very helpful to reduce the probability of miscorrection.

For correction of a detected dominant error event, all error correlation filters should work to find the type and location in a conventional post-Viterbi processor. However, since the type of an occurred dominant error event is determined only by syndrome computation with the new CRC error detection code, only one error correlation filter associated with the type of a dominant error event tries to find the corresponding location. Obviously, this can reduce the probability of misselection. Moreover, the new CRC error detection code also produces possible locations for an occurred dominant error event, so the error correlation filter checks only those locations to find the maximum. Thus, the new CRC error detection code can also reduce the probability of misposition.

Figure 14:
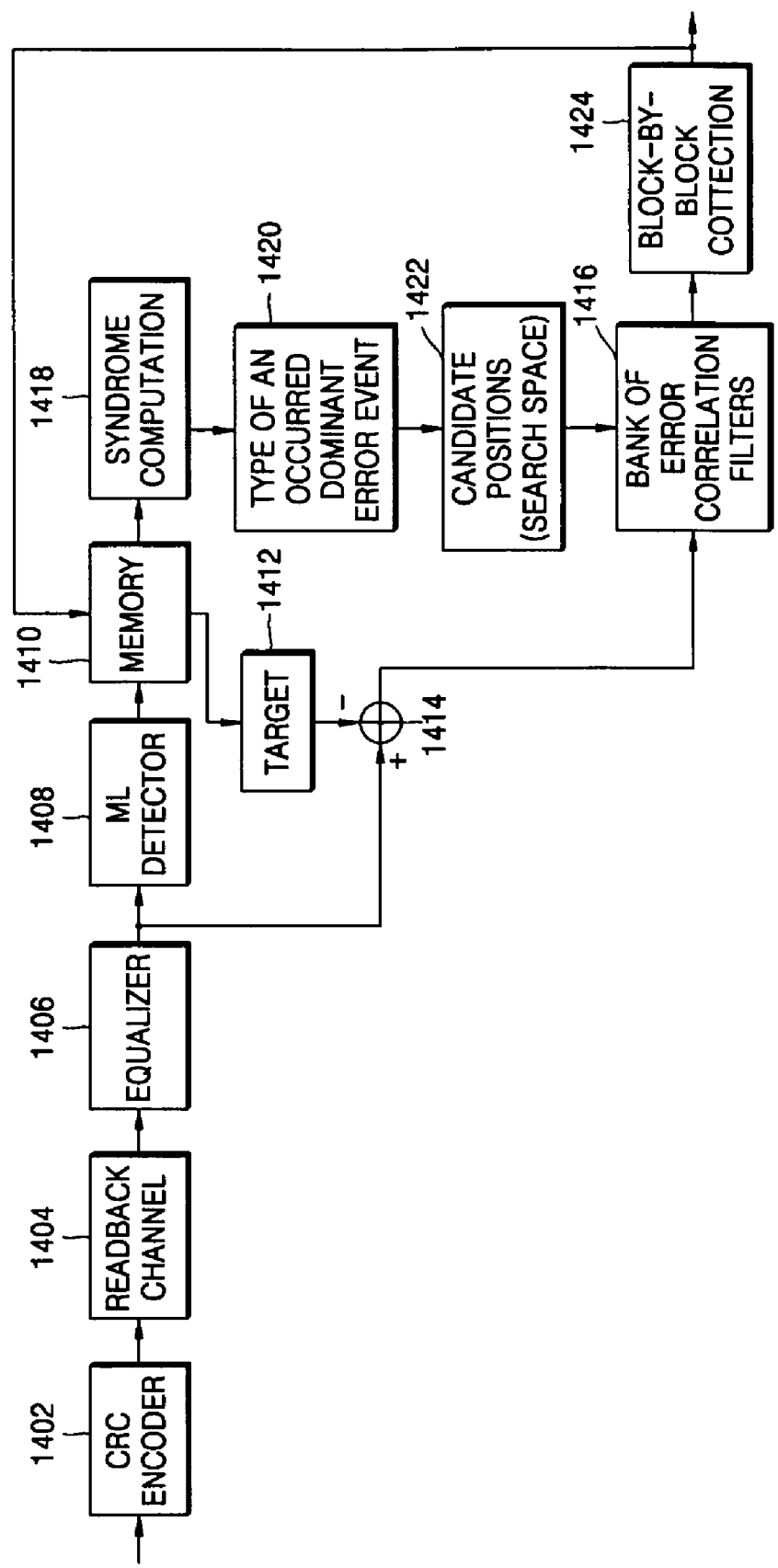
FIG. 14 illustrates a post-Viterbi processor according to an exemplary embodiment of the present invention.

FIG. 14 illustrates a post-Viterbi processor according to an exemplary embodiment of the present invention, which comprises a memory 1410, a target encoder 1412, a bank of error correlation filters 1416, a syndrome computation unit 1418, an error type determination unit 1420, an error position determination unit 1422, and an error correction unit 1424.

An EDC encoder 1402 encodes data before it is transmitted through a readback channel 1404. The EDC encoder 1402 encodes codeword based on CRC by using a non-primitive generator polynomial according to the exemplary embodiment of the present invention described with reference to FIG. 7.

An equalizer 1406 equalizes data received through the readback channel 1404 and then a ML detector 1408 detects the encoded data from the equalized data. The syndrome computation unit 1418 computes a syndrome of a codeword output by the ML detector 1408.

As soon as the syndrome is computed and it is non-zero syndrome, the type of an occurred dominant error event is determined by the error type determination unit 1420. Based on the syndrome value, possible positions for the occurred dominant error event are chosen by the error position determination unit 1422. Among six error correlation filters (at density 1.4) of the bank of error correlation filters 1416 only one error correlation filter associated with the selected dominant error event works, and the other error correlation filters does not work. The working error correlation filter now tries to find the maximum position out of the filter output at possible locations only (search space). Finally, the correction unit 1424 corrects the occurred dominant error event. In this exemplary embodiment shown in FIG. 14, the syndrome computation unit 1418, the error type determination unit 1420 and the error position determination unit 1422 are implemented separately. However it must be appreciated that these elements can be integrated into a single element, for example the syndrome computation unit 1418.

As a simple example, (36, 31) CRC code based on $g_3(x)=1+x^2+x^3+x^5$, as shown in FIG. 15, is considered. Suppose that a dominant error event [−2, 2] occurs in the $3^{rd}$ and $4^{th}$ positions. The syndrome is computed as 6 in decimal numbers, which assumes that an error event [−2, 2] is occurred within a codeword. Based on the syndrome 6, the occurred error event must start either in position 3, 9, 15, 21, 27, or 33, which is a set of possible starting positions of the error event, t can be expected. After checking two bits between each starting position and ending position, i.e., [3, 4], [9, 10], [15, 16], [21, 22], [27, 28] and [33, 34], it is found that bits in position 15 and 16 in r are all 1's, i.e., $r_{15}=r_{16}=1$, and bits in positions 27 and 28 in r are all 0's, i.e., $r_{27}=r_{28}=0$. Likewise, $r_{33}=r_{34}=0$. Thus, from the set t, those positions are eliminated because there is no probability that the occurred error event [−2, 2] occurs in those positions. Accordingly a set of possible starting positions for the error event, i.e., s (search space), is achieved.

Then, the error signal between an actual equalizer output and a detected codeword convolved with target response becomes an input signal for an error correlation filter associated with a dominant error event [2, −2]. When the error correlation filter finds the position according to the maximum value, it searches only the possible positions provided by s. Accordingly, the post-Viterbi error correction scheme according to the present invention searches only three positions (position 3, 9, and 21) to produce an actual error position because the actual error event must start in a position out of three positions. Note that the size of the search space is smaller when the length of an occurred dominant error event is longer.

Although the new CRC error detection code can detect any single occurrence of a dominant error event within a codeword, a dominant error event at a codeword boundary (end-around case) should also be considered for correction. The dominant error events at density 1.4 are [2, −2], [2, −2, 2], [2, −2, 2, −2], [2, −2, 2, −2, 2], [2, −2, 0, 2, −2] and [2, −2, 2, −2, 2, −2]. Mostly, a dominant error event at codeword boundary yields another dominant error event. For example, when a dominant error event [2, −2, 2, −2] occurs evenly between two codewords, the resulting error events are [2, −2] in each codeword. However, this is not always the case. If a most dominant error event [2, −2] occurs at codeword boundary, then the resulting error event becomes a single error event ±[2], and a dominant error event [2, −2, 0, 2, −2] occurring at the codeword boundary, may become either [2, −2, 0, 2] or [−2, 0, 2, −2]. Considering all possible cases, it is found that it is necessary to count [2], [2, −2, 0, 2] and [−2, 0, 2, −2] as additional possible dominant error events within a codeword. To find out whether the type of the error events at the codeword boundary can be determined, a syndrome sequence is shown in FIG. 16.

Unfortunately, the syndrome sequences for the end-around case are the same as the syndrome sequence for a dominant error event ±[2, −2, 2, −2, 2], so that it is possible to produce a misselection between a dominant error event ±[2, −2, 2, −2, 2] and dominant error events at the codeword boundaries. But, since the frequency of a dominant error event ±[2, −2, 0, 2, −2] is just around 1%, the probability of the occurrence of either ±[−2, 0, 2, −2] or ±[2, −2, 0, 2] will be very small enough to ignore the end-around case for the error event ±[2, −2, 0, 2, −2]. However, as shown in FIG. 17, the probability of the occurrence of single error event ±[2] will be unignorably considerable because it can occur from any dominant error events.

Although the syndrome sequences for dominant error event ±[2, −2, 2, −2, 2] and single error event ±[2] are the same, the single error event ±[2] mostly occurs either at the end or beginning of a codeword because the single error event is not a dominant error event, but cased by the end-around case. When a single error event occurs at the ending position of a codeword, the corresponding syndrome must be 13. Similarly, a single error event occurred at the beginning position of a codeword must yield syndrome 16. For the cases in FIG. 17, their syndromes are given in FIG. 18.

Previously, whenever syndrome is either 31, 25, 26, 13, 16, 8, 4, 2, 1, 22, 11 or 19, the detected error event is considered as ±[2, −2, 2, −2, 2]. But, considering the end-around case (single error event) additionally, when syndrome is computed as either 13 or 16, the detected error event can be a single error event in the ending or beginning position in a codeword, respectively.

Therefore, the post-Viterbi error correction scheme of the present invention adds extra error correlation filter associated with single error event. But, the complexity is not significant because the possible position is only one. If syndrome is 13, then two error correlation filters associated with ±[2, −2, 2, −2, 2] and ±[2] work to find actual position of the detected error event. Since the syndrome is 13, the error correlation filter for single error event checks only the last position in the codeword. Eventually, between two maximum values for two error correlation filters, post-Viterbi chooses the larger value, and produces the corresponding positions of the error event. There may exist some ambiguity to choose the actual error event and position.

With the post-Viterbi error correction scheme based on a (252, 247) CRC error detection code, the bit error rates (BERs) are simulated for various SNRs, and compared to the BERs of a conventional post-Viterbi processor based on a (203, 200) CRC code in FIG. 19. As a reference, uncoded BER and the ideal BER, which counts non-dominant error events only, are also shown. To achieve user density 1.4, the corresponding channel densities for (252, 247) CRC code and (203, 200) CRC code are 1.4283 and 1.4210, respectively. The target response is [1, 6, 7, 2] and the mixed noise contains 50% medium noise and 50% AWGN for the BER simulation.

Figure 20:
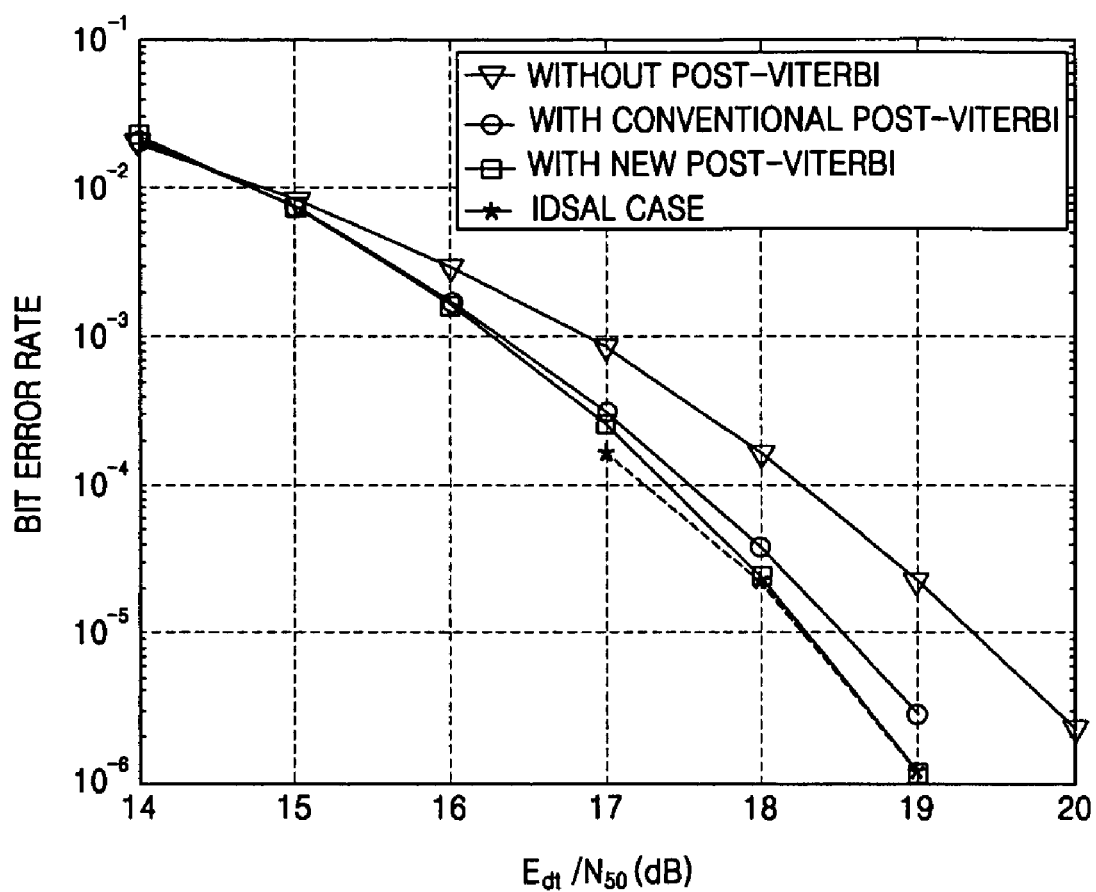
FIG. 20 shows the result of a comparison of correctability between conventional and new schemes.

It is seen that both post-Viterbi processors produce good performance gains compared to the uncoded case. In particular, the post-Viterbi error correction scheme of the present invention gives more performance gain than the conventional one. The comparison of correctability for each error type between two schemes is summarized in FIG. 20. The probability of occurrence of each error type is also shown. The correctability check and the occurrence probabilities are obtained from captured error events and error events after post-Viterbi error correction associated with each codeword block at BER=$2.2600 \times 10^{-5}$.

As expected, the generated error events mostly consist of a set of a dominant error event within a codeword and at codeword boundary (95.15%). While the conventional post-Viterbi processor gives unignorable miscorrection for the set of dominant error events, the present invention yields very rare miscorrection because the type is exactly determined and actual error position must be in a set of possible positions based on the syndrome value. The miscorrection of the conventional scheme here produces either an error event of the same length as the occurred dominant error event due to mispositioning, or an error event even longer than the occurred one due to misselection.

Thus, the unignorable miscorrection in the conventional post-Viterbi processor is the main source of bit errors at the output of detector. Although a dominant error event occurs at codeword boundary, the two separate dominant error events become either another version of dominant error events or two single error events ±[2]. Since the present invention cares about the single error event, it can be corrected with very high probability.

For multiple dominant error events within a codeword, the conventional scheme may have more chance to correct one of them because an associated error correlation filter just tries to find a position yielding maximum value through all positions in a codeword block. But, the present invention fails to correct them because multiple dominant error events within a codeword can't give correct information about the type.

For example, suppose that a dominant error event [2, −2] occurs in the 7$^{th}$ and 8$^{th}$ positions within a codeword. Also, suppose that the same error event occurs in the 116$^{th}$ and 117$^{th}$ positions within the codeword. Then, the syndrome values for the first and second error events are 24 and 12, respectively, i.e., [1 1 0 0] and [0 1 1 0 0]. The resulting syndrome value is then 20, i.e. [1 0 1 0 0]. Based on the syndrome value 20, the type of the occurred dominant error event at all in FIG. 16 cannot be found, so the multiple dominant error events cannot be corrected. As another example, suppose that two dominant error events [2, −2] and [2, −2, 2] occur in the positions 13 and 14, and 197, 198 and 199, respectively. Then, the syndrome values for the two dominant error events are 24 and 28, i.e. [1 1 0 0 0] and [1 1 1 0 0]. So, the resulting syndrome becomes 4, i.e. [0 0 1 0 0]. The syndrome value 4 makes the detector determine the occurred error event is dominant error event [2, −2, 2, −2, 2], which is misselection. However, although the present invention does not work well for multiple dominant error events within a codeword, the frequency of the case is small (around 2.0%) compared to the frequencies of the other occurrence cases.

For multiple error events at codeword boundaries, both schemes do not correct the error events. Likewise, for a single or multiple non-dominant error event(s) either within a codeword or at codeword boundaries, both schemes are supposed not to correct them, which is inevitable.

As the SNR increases, multiple dominant error events or non-dominant error event(s) occur very rarely. Therefore, while both schemes give similar performance at SNR=14, 15 and 16 dB, the present invention produces more performance gain from SNR=17 dB. The performance gains compared to the conventional schemes are around 0.15 dB and 0.3 dB at BER=10$^{-4}$ and 10$^{-5}$, respectively. In addition, the BERs of the present invention at 18 and 19 dB almost achieve the ideal BERs because most error events are dominant error events, and the dominant error events tend to occur once within a codeword.

An (n, k, t) Reed-Solomon (RS) code, can correct up to t symbol errors in an n-symbol code block including k information symbols. Here the sector error rate (SER), defined as the ratio of the number of uncorrectable sectors to the total number of transmitted sectors, is computed under the assumption that an outer RS code is applied. One popular way of doing this calculation is based on the multinomial distribution for the probabilities of the occurrences of symbol errors associated with their length [5-8].

For each length-i symbol error, where i=1, . . . k, let $x_i$ and $p_i$ respectively be the number and the probability of occurrence, respectively. The probability density function based on the multinomial distribution is then described by $$f_{x_1,\ldots,x_k}(x_1, \ldots, x_k) = \frac{n!}{x_1! x_2! \cdots x_{k+1}!} \cdot p_1^{x_1} p_2^{x_2} \cdots p_{k+1}^{x_{k+1}} \quad (6)$$

where $X_{k+1}$ and $p_{k+1}$ denote the number and the probability of no erroneous symbols in a sector, and accordingly, $$\sum_{i=1}^{k+1} p_i = 1 \text{ and } \sum_{i=1}^{k+1} x_i = n.$$

The probabilities $p_i$'s are estimated from the captured symbol error statistics.

To compute the SER for a 512-information-byte sector, a shortened RS code based on GF(2$^{10}$) is used. The overall user density D'$_u$ taking into account the outer RS code is defined as D'$_u$=D$_U$·R', where R' is the code rate of the outer RS code. Since an (n, k, t) shortened RS code can correct up to t symbol errors in a sector and does not require an interleaving, the probability of an uncorrectable sector, which is the SER, is simply given by $$P_{sector} = 1 - \sum_{x_1} \cdots \sum_{x_k} f_{x_1,\ldots,x_k}(x_1, \ldots, x_k) \quad (7)$$

where the sum is over all combinations of $x_1, \ldots, x_k$ such that $$\sum_{i=1}^{k} i \cdot x_i \le t.$$

FIG. 21 illustrates the sample probabilities of generated symbol errors associated with their lengths at the output of the uncoded ML detector, the conventional post-Viterbi processor and the present invention at various SNRs (16, 17 and 18 dB). To obtain correct statistics of symbol errors, a very large number of symbol errors should be generated so that each probability $p_i$ converges to its true value. As shown in FIG. 21, while both the conventional scheme and the present invention give similar length-1 and slightly different length-2 symbol error statistics, the conventional post-Viterbi processor statistically produces length-3 burst errors, mostly because of the miscorrection of the conventional scheme.

Figure 22:
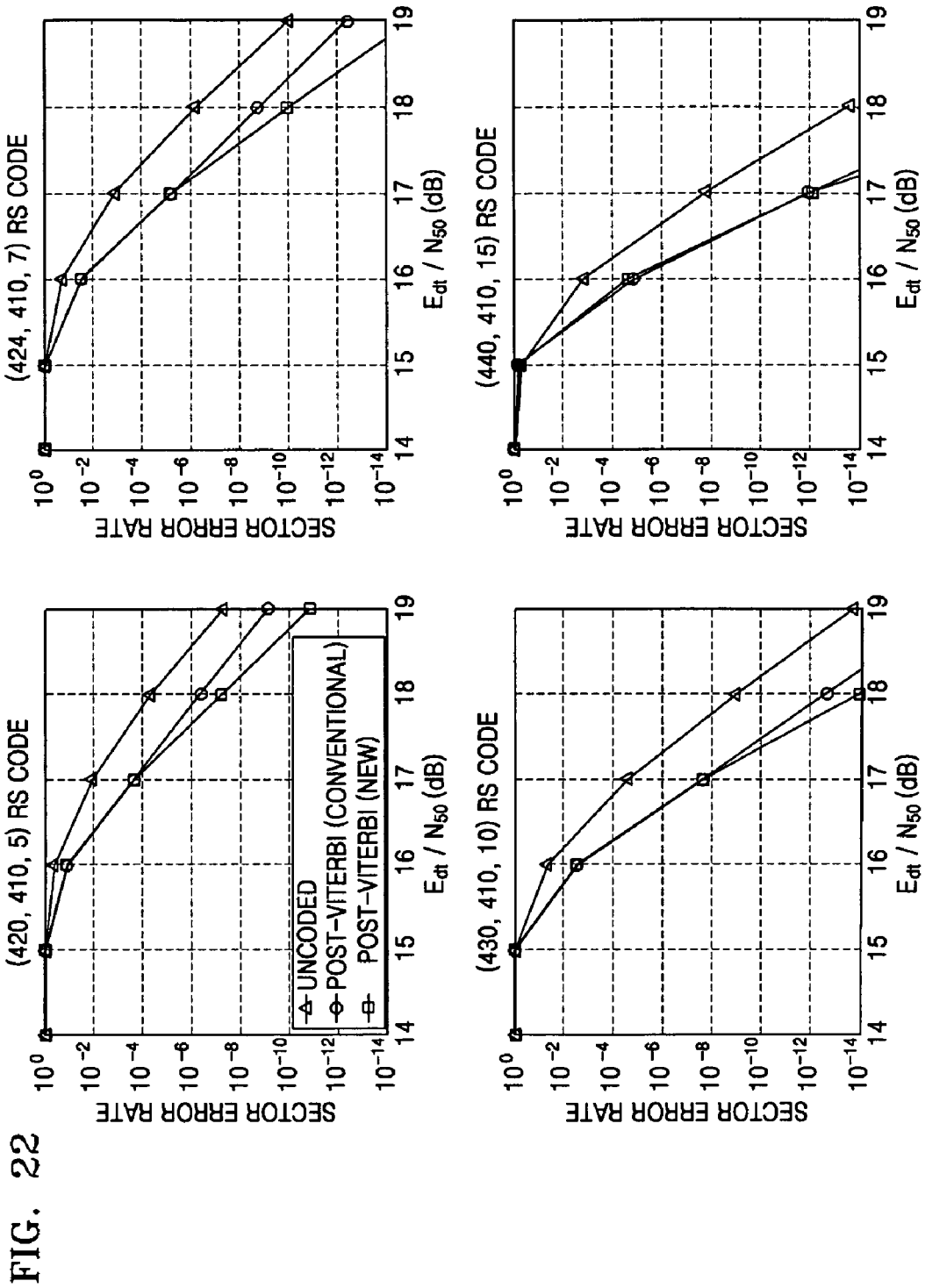
FIG. 22 illustrates the comparison of SERs of the three schemes for various RS codes according to the present invention.

FIG. 22 illustrates the comparison of SERs of the three schemes for various RS codes, i.e., (420, 410, 5), (424, 410, 7), (430, 410, 10) and (440, 410, 15) RS codes. The overall user densities (D'$_u$) are 1.3667, 1.3538, 1.3349 and 1.3045 for each RS code. It is seen in FIG. 22 that both the conventional post-Viterbi error correction scheme and the present invention clearly give SER performance gains compared to the uncoded case, and the new scheme produces more SER performance gain than the conventional scheme at SNRs higher than 17 dB. The performance gain with the statistics of burst errors shown in FIG. 20 can be show that the conventional scheme yields longer burst errors in general, and the occurrence probability of burst errors in the present invention is lower at 18 dB. As a result, the SNR gain at SER=10$^{-12}$ is seen to be around 0.46 dB and 0.2 dB with (424, 410, 7) and (430, 410, 10) RS codes, respectively. It is also observed that the performance gain is smaller because as the number of correctable symbol is increased, the SER of 10$^{-12}$ is achieved at lower SNR, and the two SERs are similar up to 17 dB.

As described above, according to exemplary embodiments of the present invention, based on a set of dominant error events in perpendicular recording, a non-primitive generator polynomial is induced that produces a unique set of syndromes for each dominant error event. Consequently, each set of syndromes corresponds to only one dominant error event.

Then, the type of an occurred dominant error event can be immediately determined by one syndrome computation without any ambiguity, which almost eliminates the misselection in a conventional post-Viterbi processor for a single dominant error event within a codeword.

Moreover, using a periodic property of the syndrome sequence and characteristic of the determined error type, a set of likely error positions for the detected dominant error event can also be obtained. Afterwards, an error correlation filter associated with the determined type tries to find actual error position among the given likely error positions.

Since the actual error position must be in the set of likely error positions, the probability of the mispositioning in a conventional scheme can be subsequently reduced. It is shown through computer simulations that the new post-Viterbi error correction scheme performs better than a conventional post-Viterbi processor at moderate to high signal-to-noise ratio because of considerably low probability of the miscorrection, which consists of the misselection and the mispositioning.

Exemplary embodiments of the present invention can be embodied as a method, an apparatus, or a system. When embodied as computer readable code/instructions, e.g., software, elements of exemplary embodiments of the present invention may be implemented by code segments, for example. Programs and/or the code segments may be stored in a medium, e.g., a computer-readable recording medium, and/or may be transmitted through a transmission medium and/or over a communications network as computer data signals associated with carrier waves. Examples of the medium may include nearly all kinds of media for storing and/or transmitting data. For example, examples of the medium can include at least an electronic circuit, a semiconductor memory device, a ROM, a flash memory, an erasable ROM, a floppy disk, an optical disk, a hard disk, an optical fiber medium, and a radio frequency (RF) network, etc. Examples of computer data signals include nearly all types of signals that are storable and/or transmittable on such a storage/transmission medium as an electronic network channel, an optical fiber, air, an electromagnetic system, and an RF network, for example.

Exemplary embodiments of the present invention can also be applied not only to various disk drives, such as hard disk drives, but to other types of data storage devices.

Thus, although a few exemplary embodiments of the present invention have been shown and described, it would be appreciated by those skilled in the art that changes might be made in these exemplary embodiments without departing from the principles and spirit of the invention, the scope of which is defined in the claims and their equivalents.

What is claimed is:

1. A computer-implemented method for detecting an occurrence of an error event in data, the method comprising:
preparing an error detection code to detect a plurality of dominant error events, wherein each dominant error event has a syndrome sequence that is different from the syndrome sequences of the other dominant error events;
generating a codeword from source data using the error detection code and a non-primitive generator polynomial;
detecting an occurrence of a dominant error event in the codeword by checking a syndrome computed from the codeword; and
determining a type and likely error starting positions of the dominant error event using the syndrome sequences corresponding to the syndrome.

2. The method of claim 1, wherein the dominant error event is at least one of $\pm\{+\}$, $\pm\{+-\}$, $\pm\{+-+\}$, $\pm\{+-+-\}$, $\pm\{+-+-+\}$, $\pm\{+-+-+-\}$, $\pm\{+-0+-\}$, $\pm\{+-0\ 0+-\}$ and $\pm\{+-0+-0+-\}$.

3. The method of claim 2, wherein the error detection code is a cyclic redundancy check (CRC) code.

4. The method of claim 3, wherein in the preparing the error detection code, the CRC code comprising the syndrome sequences which are remainders as a result of dividing a dominant error event polynomial having a coefficient as the dominant error event by a non-primitive generator polynomial $g(x)$ of degree m whose period is less than $2^m-1$ that results in a unique syndrome sequence for each dominant error event.

5. The method of claim 4, wherein a value of the syndrome is not 0.

6. The method of claim 5, wherein a number of the syndrome sequences for the error event is equal to or less than the period of the non-primitive generator polynomial $g(x)$.

7. The method of claim 4, wherein the generating the codeword comprises:
calculating a source data shift polynomial;
dividing the source data shift polynomial by the non-primitive generator polynomial $g(x)$ and calculating a remainder of the source data shift polynomial; and
obtaining the codeword in which the remainder of the source data shift polynomial is added to the source data.

8. The method of claim 2, wherein the detecting the occurrence of the dominant error event in the codeword comprises:
detecting the codeword;
dividing a leading codeword polynomial having a coefficient as the codeword by a non-primitive generating polynomial and obtaining the syndrome which is a remainder as result of dividing the leading codeword polynomial by the non-primitive generating polynomial;
checking whether the syndrome is 0;
if the syndrome is not 0, determining that the codeword contains an error event/error events; and
if the syndrome is 0, determining that the codeword does not contain any error event.

9. The method of claim 8, wherein the detecting the occurrence of the dominant error event in the codeword detects whether an error event occurs at codeword boundary.

10. The method of claim 2, wherein in the determining the likely error starting positions of the dominant error event comprises:
(d1) inducing likely error starting locations for the dominant error event in the codeword by comparing the syndrome with the syndrome sequences corresponding to the dominant error event
(d2) determining an exact location of the dominant error event in the codeword.

11. The method of claim 10, wherein the determining the exact location of the dominant error event comprises
applying the codeword to an error correlation filter corresponding to the detected dominant error events whose type is determined;
selecting a maximum likelihood error event based on an output of the error correlation filter; and
selecting a position that corresponds to the maximum likelihood error event.

12. The method of claim 1, wherein the error detection code is a cyclic redundancy check (CRC) code.

13. The method of claim 12, wherein in the preparing the error detection code, the CRC code comprising the syndrome sequences which are remainders as a result of dividing a dominant error event polynomial having a coefficient as the dominant error event by a non-primitive generator polynomial g(x) of degree m whose period is less than $2^m-1$ that results in a unique syndrome sequence for each dominant error event.

14. The method of claim 13, wherein a value of the syndrome is not 0.

15. The method of claim 14, wherein a number of the syndrome sequences for the error event is equal to or less than the period of the non-primitive generator polynomial g(x).

16. The method of claim 13, wherein the generating the codeword comprises:
calculating a source data shift polynomial;
dividing the source data shift polynomial by the non-primitive generator polynomial g(x) and calculating a remainder of the source data shift polynomial; and
obtaining the codeword in which the remainder of the source data shift polynomial is added to the source data.

17. The method of claim 1, wherein the detecting the occurrence of the dominant error event in the codeword comprises:
detecting the codeword;
dividing a leading codeword polynomial having a coefficient as the codeword by a non-primitive generating polynomial and obtaining the syndrome which is a remainder as result of dividing the leading codeword polynomial by the non-primitive generating polynomial;
checking whether the syndrome is 0;
if the syndrome is not 0, determining that the codeword contains an error event/error events; and
if the syndrome is 0, determining that the codeword does not contain any error event.

18. The method of claim 17, wherein the detecting the occurrence of the dominant error event in the codeword detects whether an error event occurs at a codeword boundary.

19. The method of claim 1, wherein in the determining the likely error starting positions of the dominant error event comprises:
inducing likely error starting locations for the dominant error event in the codeword by comparing the syndrome with the syndrome sequences corresponding to the dominant error event
determining an exact location of the dominant error event in the codeword.

20. The method of claim 19, wherein the determining the exact location of the dominant error event comprises:
applying the codeword to an error correlation filter corresponding to the dominant error event whose type is determined;
selecting a maximum likelihood error event based on an output of the error correlation filter; and
selecting a position that corresponds to the maximum likelihood error event.

21. An apparatus for detecting error events in a codeword, the apparatus comprising:
an data encoder which generates a codeword from source data using an error detection code and a non-primitive-generator polynomial to detect a dominant error event of a plurality of dominant error events, wherein each dominant error event has a syndrome sequence that is different from the syndrome sequences of the other dominant error events; and
an error detector which detects an occurrence of the dominant error event in the codeword received from the data encoder.

22. The apparatus of claim 21, wherein the dominant error event is at least one of ±{+}, ±{+−}, ±{+−+}, ±{+−+−}, ±{+−+−+}, ±{+−+−+−}, ±{+−0+−}, ±{+−0 0+−} and ±{+−0+−0+−}.

23. The apparatus of claim 22, wherein the error detection code is a cyclic redundancy check (CRC) code comprising the syndrome sequences which are remainders as result of dividing a dominant error event polynomial having a coefficient as the dominant error event by a non-primitive generator polynomial g(x) of degree m whose period is less than $2^m-1$ that results in a unique syndrome sequence for each dominant error event.

24. The apparatus of claim 23, wherein the codeword generated from the data encoder is made by adding a remainder as a result of dividing a source data shift polynomial by the non-primitive generator to the source data.

25. The apparatus of claim 24, wherein the error detector detects the occurrence of the dominant error event by checking whether the syndrome which is a remainder as result of dividing a codeword polynomial by the non-primitive generating polynomial is 0.

26. The apparatus of claim 25, further comprising an error corrector which corrects the dominant error event in the codeword by determining a type and likely error starting positions using the syndrome sequences for the dominant error event corresponding to the syndrome obtained in the error detector.

27. The apparatus of claim 21, wherein the error detection code is a cyclic redundancy check (CRC) code comprising the syndrome sequences which are remainders as result of dividing a dominant error event polynomial having a coefficient as the dominant error event by a non-primitive generator polynomial g(x) of degree m whose period is less than $2^m-1$ that results in a unique syndrome sequence for each dominant error event.

28. The apparatus of claim 27, wherein the codeword generated from the data encoder is made by adding a remainder as a result of dividing a source data shift polynomial by the non-primitive generator to the source data.

29. The apparatus of claim 28, wherein the error detector detects the occurrence of the dominant error event by checking whether the syndrome which is a remainder as result of dividing a codeword polynomial by the non-primitive generating polynomial is 0.

30. The apparatus of claim 29, further comprising an error corrector which corrects the dominant error event in the codeword by determining a type and likely error starting positions using the syndrome sequences for the dominant error event corresponding to the syndrome obtained in the error detector.

* * * * *